United States Patent [19]
Adachi et al.

[11] Patent Number: 5,278,451
[45] Date of Patent: Jan. 11, 1994

[54] SEMICONDUCTOR DEVICE SEALED WITH MOLD RESIN

[75] Inventors: Etsushi Adachi; Hiroshi Adachi; Hiroshi Mochizuki, all of Hyogo, Japan

[73] Assignee: Mitsubishi Denki Kabushiki Kaisha, Tokyo, Japan

[21] Appl. No.: 767,276

[22] Filed: Sep. 30, 1991

[30] Foreign Application Priority Data

Oct. 1, 1990 [JP] Japan .................. 2-264674

[51] Int. Cl.$^5$ ........................... H01L 23/28
[52] U.S. Cl. ..................... 257/790; 257/791; 525/477
[58] Field of Search .............. 357/72; 428/447; 257/790, 791; 525/477

[56] References Cited

U.S. PATENT DOCUMENTS

| | | | |
|---|---|---|---|
| 3,975,757 | 8/1976 | Spork | 357/72 |
| 4,395,527 | 7/1983 | Berger | 357/72 |
| 4,645,688 | 2/1987 | Makino et al. | 357/72 |
| 5,030,699 | 7/1991 | Motoyama | 525/477 |

FOREIGN PATENT DOCUMENTS

| | | |
|---|---|---|
| 0021818 | 6/1980 | European Pat. Off. . |
| 3805490 | 9/1988 | Fed. Rep. of Germany . |
| 55-50645 | 4/1980 | Japan . |
| 55-111148 | 8/1980 | Japan . |
| 1-92224 | 4/1989 | Japan . |

OTHER PUBLICATIONS

Japanese Abstract 63 120 774 to Mitsubishi Denki KK, May 25, 1988.
Japanese Abstract 60 229 945 to Fuhitsu KK, Nov. 15, 1985.
Japanese Abstract 86 026 6212 to Mitsubishi Electric, Jul. 11, 1986.
"New Filler-Induced Failure Mechanism in Plastic Encapsulated VLSI Dynamic MOS Memories", Matsumoto et al., Kita-Itami Works and LSI R&D Laboratory, Mitsubishi Electric Corporation, pp. 180–183.

Primary Examiner—Rolf Hille
Assistant Examiner—Roy Potter
Attorney, Agent, or Firm—Lowe, Price, LeBlanc & Becker

[57] ABSTRACT

A semiconductor device sealed with mold resin is disclosed. The device includes a semiconductor substrate having a main surface and an element formed on the main surface of the semiconductor substrate. A stress buffering film for protecting at least the element from stress of the mold resin is provided on the semiconductor substrate so as to cover at least the element. The entire semiconductor device is covered and sealed with mold resin. The stress buffering film is formed of organo-silicone ladder polymer having a hydroxyl group at its end. In the semiconductor device, water does not get into an interface of the stress buffering film and the underlying substrate, resulting in an enhancement of the moisture resistance of the semiconductor device.

9 Claims, 4 Drawing Sheets

SEMICONDUCTOR DEVICE SEALED WITH MOLD RESIN

BACKGROUND OF THE INVENTION

1. Field of the Invention

The present invention generally relates to mold resin sealed semiconductor devices, and particularly to a semiconductor device sealed with mold resin which is improved not to cause volatility defective or malfunctions of elements.

2. Description of the Background Art

In a conventional resin sealed semiconductor device, with miniaturization of semiconductor elements, there has been a problem that volatility defective or malfunctions of elements are caused due to stresses by the sealing resin. In order to solve the problem, the art is proposed wherein a stress buffering film formed of a resin layer is formed covering surfaces of elements.

FIG. 3A is a plan view of a semiconductor device disclosed in Japanese Patent Laying-Open No. 55-111148 which is the first conventional art and FIG. 3B is a cross-sectional view along the IIIB line in FIG. 3A. Referring to the figures, a silicon dioxide film 3 is formed on a surface of a semiconductor substrate 1. Openings are provided for formation of a base electrode 16 and an emitter electrode 4 in the silicon dioxide film 3. Base electrode 16 and emitter electrode 4 are provided filling the openings. A metal film body 12 is formed surrounding base electrode 16. A bonding wire 8 is connected to emitter electrode 4. Covering emitter electrode 4, base electrode 16 and metal film body 12, a phenylsilicone ladder polymer film 56 which is an undercoat resin layer is provided on semiconductor substrate 1. The phenylsilicone ladder polymer film 56 is formed by applying an anisole solution of phenylsilicone ladder polymer on semiconductor substrate 1. The backside of semiconductor substrate 1 is affixed on a lead frame 11 for external electrode picking-up. The entirety of the semiconductor device is buried in a mold resin 9.

In the above-described conventional device, metal film body 12 is formed for the purpose of preventing that water permeating mold resin 9 degrades the adhesive property between phenylsilicone ladder polymer film 56 and silicon dioxide film 3. With no metal film body 12, since the adhesive property is weak between phenylsilicone ladder polymer film 56 and silicon dioxide film 3, water gets into the interface of these films, which further reaches base electrode 16. As a result, inverse breakdown voltage is produced between base-collector, so that the device cannot effect the function as a semiconductor circuit. Accordingly, formation of metal film body 12 is essential. On the other hand, however, there have been problems that it makes the structure complex and manufacturing process complicated.

Also, the semiconductor device has a problem that its reliability is decreased because, since silicone ladder polymer film 56 is formed on the surface of the semiconductor substrate after connecting bonding wire 8 to emitter electrode 4, there is no stress buffering film on the surface of semiconductor substrate 1 in the processes until that time.

FIGS. 4A–4F illustrate in cross-sectional views steps of manufacturing a semiconductor device provided with ladder type organo-silicone polymer disclosed in Japanese Patent Laying-Open No. 55-50645 which is the second conventional art.

Referring to FIG. 4A, a base region 13 and an emitter region 14 are formed in a surface of a semiconductor substrate 1 (silicon substrate).

Referring to FIG. 4B, a cyclohexanone solution of ladder type organo-silicone polymer (a polymer obtained by heating a mixture of phenyltriethoxysilane and γ-phenylaminopropyltriethoxysilane) is applied with a spinner on the surface of semiconductor substrate 1, which is dried to form an organo-silicone polymer film 106.

Referring to FIG. 4C, a photoresist 7 having openings at portions located above electrode picking-up holes of a collector region 1a, base region 13 and emitter region 14 is formed on organo-silicone polymer film 106.

Referring to FIGS. 4C and 4D, using the photoresist 7 as a mask, organo-silicone polymer film 106 is etched using 1, 1, 1-trichloroethane. Next, removing photoresist 7, a thermal treatment is applied at 350° C. for one hour to make a cross linked ladder type organo-silicone polymer film 106.

Referring to FIG. 4E, an aluminum evaporating film 15 is formed on semiconductor substrate 1 so as to fill openings of organo-silicone polymer film 106, and a photoresist 7 having predetermined shape is formed on aluminum evaporating film 15.

Referring to FIGS. 4E and 4F, using photoresist 7 as a mask, aluminum evaporating film 15 is etched, and removing photoresist 7 subsequently, an aluminum electrode 4 is formed.

According to the above-described second conventional art, since organo-silicone polymer film 106 which is a stress buffering film is formed on the surface of semiconductor substrate 1, the elements are protected in the process. However, in the second conventional art, there have been problems described below.

That is, referring to FIGS. 4C and 4D, 1, 1, 1-trichloroethane is employed for etching organo-silicone polymer film 106. 1, 1, 1-trichloroethane produces hydrogen chloride which is corrosive in a reaction with water, and is easily decomposed with fire to produce gas such as hydrogen chloride. Since 1, 1, 1-trichloroethane has such properties, there have been problems such that it must be handled with great care and selection of materials of an etching device and an etching container is limited. Furthermore, in the second conventional art, although it is made clear that the leak current between source/drain is stable even after leaving the device under circumstances of high temperature, it is not clear if the elements are protected from stresses of mold resin.

SUMMARY OF THE INVENTION

It is an object of the present invention to provide a mold resin sealed semiconductor device with excellent moisture resistance and high reliability.

It is another object of the present invention to provide a mold resin sealed semiconductor device which is improved in which the adhesive property between a stress buffering film for protecting an element from stress of mold resin and a semiconductor substrate thereby to prevent water from getting into their interface.

It is still another object of the present invention to couple a stress buffering film for protecting an element from stress of mold resin and a semiconductor substrate with covalent bond, so that the two are strongly bonded.

It is yet another object of the present invention to obtain a mold resin sealed semiconductor device having an organo-silicone ladder polymer film which can be formed using no 1, 1, 1-trichloroethane.

The present invention relates to a semiconductor device which is sealed with mold resin. The semiconductor device includes a semiconductor substrate having a main surface and an element formed on the main surface of the semiconductor substrate. A stress buffering film for protecting at least the element from stress of the mold resin is provided on the semiconductor substrate covering at least the element. The entirety of the semiconductor device is sealed so that it is encapsulated with the mold resin. The stress buffering film is formed of an organo-silicone ladder polymer having a hydroxyl group at its end.

According to a preferable embodiment of the present invention, an organo-silicone ladder polymer is expressed by the following general formula (1).

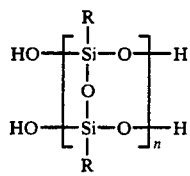

In the formula (1), the substitution group R is a phenyl group, a phenylhalide group, a methylphenylhalide group or an alkyl group such as methyl, propyl, butyl, amylhexyl. An organo-silicone ladder polymer having a hydroxyl group at its end has properties different corresponding to the difference of its side chain. For example, a polymer having a phenyl group as a substitution group R has its heat resistance enhanced by 50° C. or more as compared to a polymer having a methyl group as a substitution group R. Accordingly, in consideration of the heat resistance for a heat treatment after formation of a stress buffering film, an organo-silicone ladder polymer having a phenyl group as the side chain is the most suitable.

The organo-silicone ladder polymer in which its side chain is a phenyl group also has an advantage that it easily constitutes a polymer with high molecular weight as compared to an organo-silicone ladder polymer in which its side chain is a methyl group.

In the formula (1), n is an integer, which is preferably an integer selected so that the weight-average molecular weight of organo-silicone ladder polymer is one hundred thousand or more. This is because a stress buffering film requires a certain amount of film thickness for buffering the stresses from mold resin. In order to produce a stress buffering film which can suppress occurrence of cracks and having necessary film thickness, the weight-average molecular weight of an organo-silicone ladder polymer is necessarily one hundred thousand or more. However, while the film forming property is enhanced with an increase in the molecular weight, there is a problem that etching is becoming more difficult. Accordingly, the weight-average molecular weight of the organo-silicone ladder polymer is preferably at least one hundred thousand and at most two hundred thousand. The effects of the present invention will be described below.

Generally, an inorganic film such as a silicon oxide film, a silicon nitride film or the like as a final protecting film is formed on a substrate on which a stress buffering film is formed. A lot of hydroxyl groups exist on the surface of the inorganic film. According to the present invention, since the stress buffering film is formed of organo-silicone ladder polymer having a hydroxyl group at its end, a chemical reaction (dehydration reaction) occurs between the hydroxyl group on the substrate surface and the hydroxyl group of the organo-silicone ladder polymer, resulting in a strong bond between the two. Accordingly, the adhesive property of a stress buffering film formed of the organo-silicone ladder polymer and the underlying substrate is enhanced. As a result, the problem that water gets into the interface of the stress buffering film and the underlying substrate is solved, leading to enhancement in the moisture resistance of a semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be described below referring to the figures.

Figure 1:
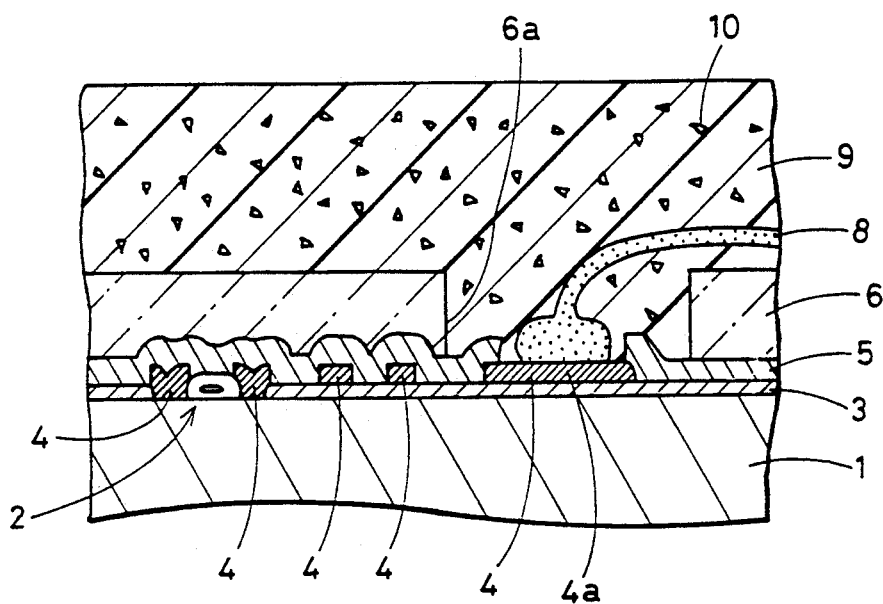
FIG. 1 is a cross-sectional view of a mold resin sealed semiconductor device according to one embodiment of the present invention.

FIG. 1 is a cross-sectional view of a semiconductor device encapsulated with mold resin according to one embodiment of the present invention.

Referring to FIG. 1, an underlying insulating film 3 is formed on a semiconductor substrate 1. An opening is provided in a part of underlying insulating film 3, and a transistor 2 is formed in the opening. An aluminum interconnection 4 is formed on underlying insulating film 3. A part of aluminum interconnection 4 is connected to source/drain regions of transistor 2. The aluminum interconnection 4 includes a bonding pad 4a. Covering transistor 2 and aluminum interconnection 4, a final protecting film 5 is provided for protecting transistor 2, aluminum interconnection 4 and so forth over the entire surface of semiconductor substrate 1. Final protecting film 5 has an opening for exposing a part of bonding pad 4a. An organo-silicone ladder polymer film 6 which functions as a stress buffering film expressed by the following structural formula (1) having a weight-average molecular weight of 150,000 is formed on final protecting film 5.

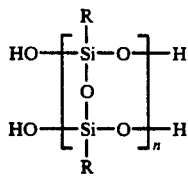

$$(1)$$

The film thickness of organo-silicone ladder polymer film 6 is approximately 4μm. An opening 6a for exposing bonding pad 4a is provided in organo-silicone ladder polymer film 6. A bonding wire 8 is connected to bonding pad 4a through the opening 6a. The entirety of the semiconductor device is encapsulated with mold resin 9. Filler 10 is filled in mold resin 9.

According to a device of the embodiment, since organo-silicone ladder polymer film 6 includes a hydroxyl group on its end as shown by the formula (1), a chemical reaction is caused between hydroxyl radicals existing on the surface of final protecting film 5 and hydroxyl radicals of organo-silicone ladder polymer film 6 by the thermal treatment, resulting in formation of strong covalent bond between the two. Accordingly, the adhesive property is enhanced between organo-ladder polymer film 6 which is a stress buffering film and final protecting film 5. As a result, water does not get into the interface of organo-silicone ladder polymer film 6 and final protecting film 5, resulting in an improvement in the moisture resistance of the semiconductor device.

EXAMPLE 1

Next, referring to FIGS. 2A-2D, a method of manufacturing the semiconductor device encapsulated with mold resin shown in FIG. 1 will be described.

Figure 2A:
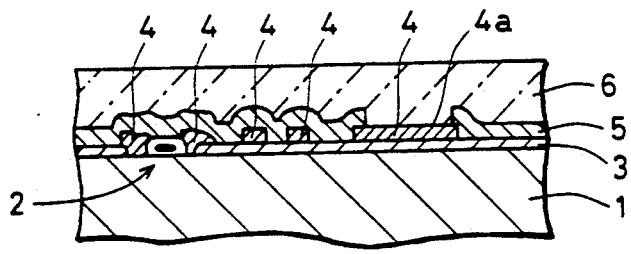
FIGS. 2A-2D are partial sectional views of a semiconductor device in the respective steps in order of a manufacturing method of the semiconductor device shown in FIG. 1.

Referring to FIG. 2A, an underlying insulating film 3 is formed on a semiconductor substrate 1. An opening is provided for forming a transistor 2 in underlying insulating film 3, and transistor 2 is formed in the opening. An aluminum interconnection 4 including a bonding pad 4a is formed on underlying insulating film 3. Covering transistor 2 and aluminum interconnection 4, a final protecting film 5 is formed for protecting transistor 2 and aluminum interconnection 4 above semiconductor substrate 1. The final protecting film 5 is an inorganic film such as a silicon oxide film or a silicon nitride film, for example, which has a lot of hydroxyl groups on its surface. Final protecting film 5 is selectively etched to expose bonding pad 4a. Covering final protecting film 5, an anisole solution (prepared to a concentration of 25 weight %) of an organo-silicone ladder polymer having hydroxyl groups at its ends shown by the above formula (1) which has the weight-average molecular weight of 150,000 is spin-coated on semiconductor substrate 1 to form an organo-silicone ladder polymer film 6 of 4μm. Subsequently, a thermal treatment is applied at 250° C. for 30 minutes.

A method of manufacturing the organo silicone ladder polymer shown by the formula (1) will be described later as a reference example 1. The organo-silicone ladder polymer used in the example 1 includes alkali metal, iron, lead, copper and hydrogen halogenide of contents of 1ppm or less, respectively, and uranium and thorium of contents of 1ppb or less, respectively.

Figure 2B:
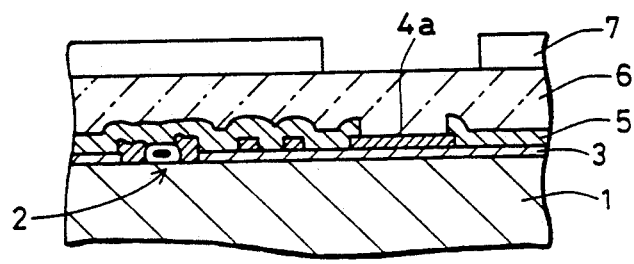

Next, referring to FIG. 2B, after brought to the room temperature, a photoresist 7, e.g., positive type photoresist OFPR800 (manufactured by Tokyo Oka Kabushiki Kaisha) is applied on organo-silicone ladder polymer film 6 (the film thickness is made 5μm). With exposure using a mask (not shown) and the alkali development, a portion of photoresist 7 located on bonding pad 4a is selectively removed. Subsequently, without using a mask, ultraviolet rays are radiated upon the entire surface of semiconductor substrate 1.

Figure 2C:
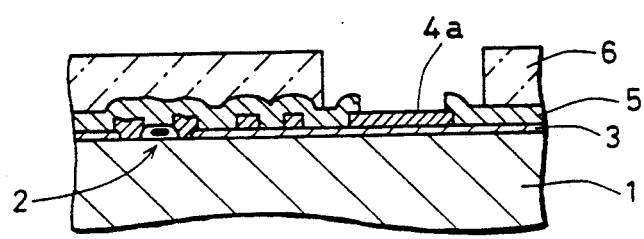

Referring to FIGS. 2B and 2C, using an anisole/xylene mixture solvent in which the concentration of the anisole is 30 volume %, the spin development (etching of organo-silicone ladder polymer film 6 using a photoresist 7 as a mask) is performed for one minute. Subsequently, photoresist 7 is removed using n-butyl acetate, and a thermal treatment is applied at 350° C. for one hour. Referring to FIG. 2C, covering part except bonding pad 4a, an organo-silicone ladder polymer film 6 which is a stress buffering film is thus formed.

Figure 2D:
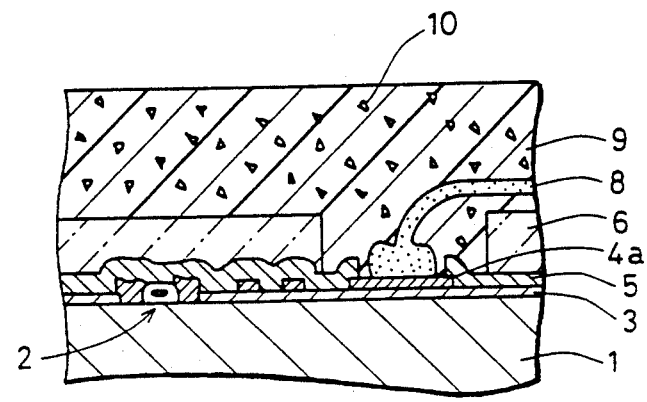
Figure 3A:
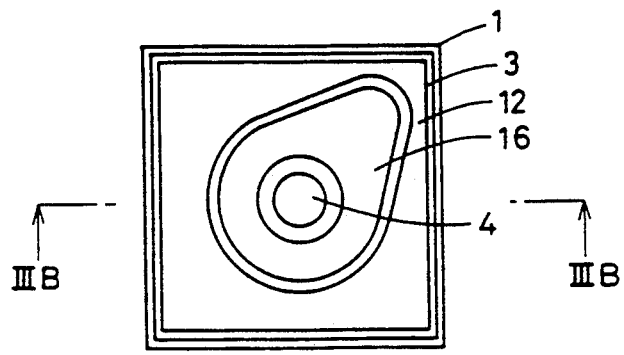
FIG. 3A is a plan view of a conventional mold resin sealed semiconductor device and FIG. 3B is a cross-sectional view along the IIIB-IIIB line in FIG. 3A.
Figure 3B:
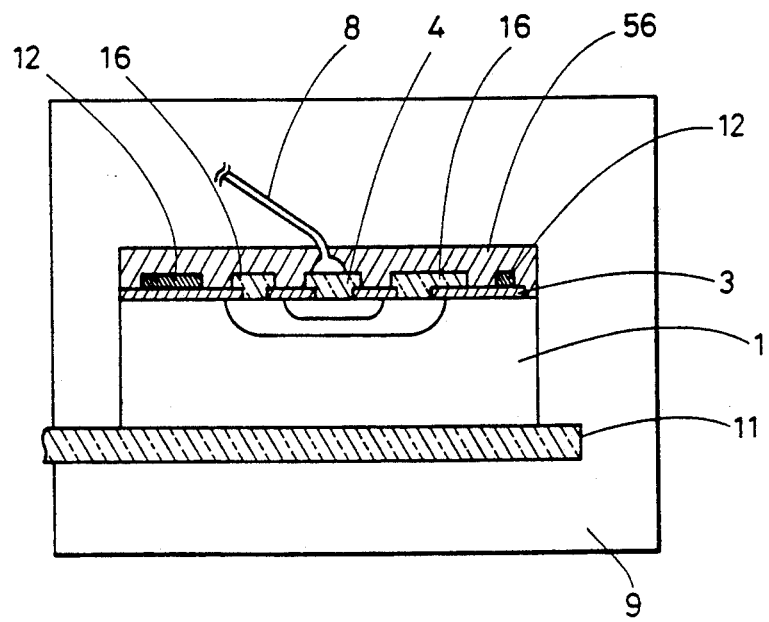
Figure 4A:
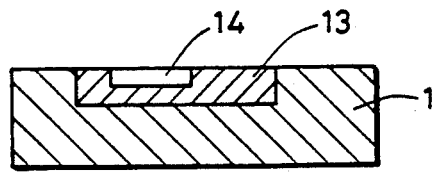
FIGS. 4A-4F are partial sectional views of a semiconductor device in the respective steps in order of a manufacturing method of a semiconductor device according to another conventional example.
Figure 4B:
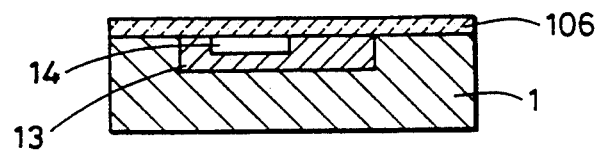
Figure 4C:
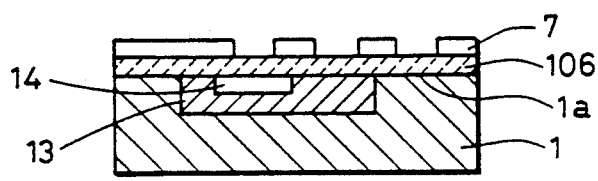
Figure 4D:
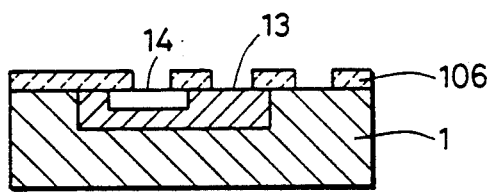
Figure 4E:
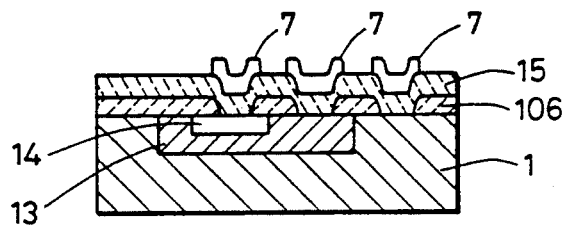
Figure 4F:
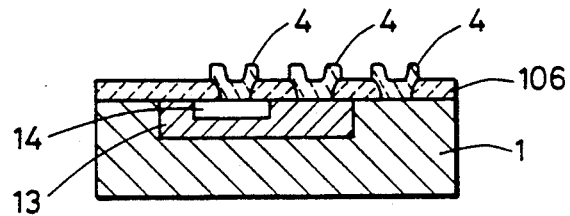

Referring to FIG. 2D, bonding pad 4a and a lead frame (not shown) are connected to each other with a bonding wire 8. Subsequently, the entire semiconductor device is encapsulated with mold resin 9 in which fillers are filled.

In the inspection of volatility defective of transistors of semiconductor devices manufactured in this way, the fraction defective was 0%.

Furthermore, a pressure cooker test was performed for 1000 hours under conditions of 220° C. and 2 atmospheric pressure for the mold resin sealed semiconductor device manufactured by the above-described method. Opening the resin seal to inspect the inside, no abnormality was found.

Heat shocks (H/S) of −196° C. and 260° C. are applied for one hour at respective temperatures, which was repeated for 500 times. Opening the semiconductor for the inspection inside, no abnormality was found.

As described above, in the mold resin sealed semiconductor device shown in FIG. 1, the stresses of mold resin 9 could be buffered, and furthermore, cracks of final protecting film 5 and mechanical deformation of aluminum interconnection 4 could be prevented. Also, malfunctions of transistors due to local stresses by filler 10 could be prevented.

COMPARATIVE EXAMPLE 1

For comparison with the semiconductor device obtained by the example 1, a semiconductor device having no stress buffering film at all and a semiconductor device in which an organo-silicone ladder polymer film 6 expressed by the formula (1) is provided having a film thickness of 2μm are prepared. These two kinds of comparative samples were manufactured under the same conditions as those in the example 1 except the organo-silicone ladder polymer film. In the inspection of the fraction defective of the two kinds of transistors, it is revealed that the semiconductor device having no organo-silicone ladder polymer film has fraction defective of 5%. The semiconductor device having an organo-silicone ladder polymer with a film thickness of 2μm has 3% of defectives. This comparative test clearly showed that an organo-silicone ladder polymer film shown by the formula (1) is preferably formed having a film thickness of 4μm or more. In another experiment, it is shown that the film thickness is preferably formed 10μm or less.

COMPARATIVE EXAMPLE 2

For comparison with the semiconductor device obtained by the example 1, a semiconductor device (a comparative sample 2) is prepared which includes alkali metal, iron, lead, copper and hydrogen halogenide of 10ppm, respectively, and is expressed by the formula (1). Other forming conditions were the same as those in the example 1. A pressure cooker test has been performed for the comparative sample 2 and then the sealing resin is opened for an inspection inside, then, corrosion of aluminum was found in an opening of a bonding pad.

COMPARATIVE EXAMPLE 3

For comparison with the semiconductor device obtained in the example 1, a semiconductor device in which an organo-silicone ladder polymer film 6 is formed only on a semiconductor element is prepared as a comparative sample 3. Except that the organo-silicone ladder polymer is formed only on a semiconductor element, the structure was the same as that of the example 1. No defective was found in the transistor of the comparative sample 3, but in a heat shock test of the comparative sample 3, the outside of the bonding pad is deformed, and cracks in final protection film 5 were found. That is, it seems that the thermal stresses from the mold resin 9 is especially likely to be applied to an end portion of an element, and the comparative sample 3, which does not have a stress buffering film at that portion, is likely to suffer from defectives.

COMPARATIVE EXAMPLE 4

For comparison with the semiconductor device obtained by the example 1, a semiconductor device is prepared in which an organo-silicone ladder polymer film 6 same as that in the example 1 is formed by the dropping method (a comparative example 4). In this case, control of the film thickness was difficult. Other conditions were the same as those in the example 1. Performing the heat shock test of the comparative sample 4, one in which bonding wire 8 is separated from bonding pad 4a was found.

COMPARATIVE EXAMPLE 5

The organo-silicone ladder polymer expressed by the formula (1) having the weight-average molecular weight of 250,000 was prepared. Using the polymer, the pattern formation of organo-silicone ladder polymer film 6 is made as shown in FIGS. 2B and 2C. Using an anisole/xylene mixture solvent in which the anisole concentration is 30 volume %, an organo-silicone ladder polymer film having a film thickness of 4μm was etched. However, after performing the etching process for 3 minutes, residue was still found. Also, erosion of the side etching and a resist end portion was considerable. Even using an anisole/xylene mixture solvent in which the anisole concentration is 50 volume %, the etching time takes about 2 minutes and also the pattern form was not good.

COMPARATIVE EXAMPLE 6

Organo-silicone ladder polymer shown by the formula (1) having the weight-average molecular weight of 70,000 was prepared. For obtaining a film having a film thickness of 4μm by spin-coating the polymer on a semiconductor substrate, the solvent concentration should be necessarily 35 weight % or more. After the spin-coat, applying a thermal treatment at 350° C., cracks are caused in the film. Also, the film thickness was not uniform.

COMPARATIVE EXAMPLE 7

In order to compare the adhesive properties, the checkers test of JIS-K5400 was performed. A film with a film thickness of 4μm was formed using organo-silicone ladder polymer having hydroxyl group at its end (the weight-average molecular weight 150,000) shown by the formula (1) above a silicon substrate on which an insulating film the same as the final protecting film is deposited. On the other hand, on a substrate same as that mentioned above, a film with a film thickness of 4μm was formed using organo-silicone ladder polymer with an ethoxy group at its end (the weight-average molecular weight 150,000). A thermal treatment at 350° C. is applied thereto for one hour, respectively, to form films. Performing a pressure cooker test under conditions of 120° C. and 2 atmospheric pressure, it was found out that 50% of the sample having ethoxy groups at its ends suffered from separation in 100 hours. On the other hand, no separation was caused at all even after 1000 hours have passed in the sample with hydroxyl groups on its ends. That is, the result shows that water does not comes into between organo-silicone ladder polymer film 6 and final protecting film 5 using organo-silicon ladder polymer having a hydroxyl group at its end expressed by the formula (1).

COMPARATIVE EXAMPLE 8

In organo-silicone ladder polymer having a hydroxyl group at its end shown by the formula (1), an organo-silicone ladder polymer with a phenyl group in its side chain (hereinafter, referred to as phenyl ladder polymer) and an organo-silicone ladder polymer with a methyl group in its side chain (hereinafter, referred to as methyl ladder polymer) are made to compare the heat resistance. Films of the phenyl ladder polymer and the methyl ladder polymer (each having the weight-average molecular weight of 120,000) with film thickness of 3μm are formed on silicon substrates to implement squares having each side of 100μm. After leaving it for one hour at 500° C. in a $N_2$ bake chamber, the change in film thickness was checked. The film thickness of the methyl ladder polymer was reduced by 15% as compared to the original one, but the film thickness of the phenyl ladder polymer was not reduced.

REFERENCE EXAMPLE 1

The organo-silicone ladder polymer having a hydroxyl group at its end indicated by the formula (1) is made by the method disclosed in Japanese Patent Laying-Open No. 1-92224. The outline thereof will be described below. The material, phenyltrichlorosilane, was distilled at temperature of 81°–82° C. under reduced pressure of 15mmHg and under nitrogen atmosphere. The distilled phenyltrichlorosilane (317.4g) and methyl isobutylketone of the ELSS grade of 960ml were mixed. The mixture solvent is put in a 4-ports frask having capacity of 2l to which a dropping funnel, a thermometer and a stirrer are attached, and cooled to 20° C. Next, cooling maintaining the temperature and stirring, ultrapure water of 200ml is gradually dropped for 1–3 hours. At this time, hydrogen chloride was considerably produced. After dropping, kept stirring for further two hours, the hydrolysis reaction was finished. The prepolymer solution is moved to a separatory funnel and left still to separate the prepolymer solution into two layers. Next, the water layer including a larger amount of hydrogen chloride as the lower layer was removed to collect an organic layer containing prepolymer. Ultra-pure water of volume the same as that of the organic layer is added to the organic layer, permeating, and washed. The washing treatment was repeated for five times and then the amount of impurity contained in the prepolymer after washing was analyzed by an ion-chromatography analysis apparatus (produced by Yokokawa Hokushin Denki Kabushiki Kaisha, Model No.: IC-500). As a result, the content of chlorine ions in the prepolymer was approximately 1000ppm in the first time washing in any cases, and 1ppm or lower in the third washing. The concentration of kalium ions is also reduced with the number of times of washing, which was 1ppm or lower after the third washing.

Next, the weight-average molecular weight of the prepolymer was measured using gel-permeation chromatography (produced by Nihon Buko Kabushi Kaisha, Model No.: DRI-ROTARVI). The weight-average molecular weight of the prepolymer was 3900. The amounts of the contained impurities in the prepolymer after washing three times were; natrium, kalium, iron, copper, lead and chlorine, each content 1ppm or less, and each content of uranium and thorium which are radioactive elements was 1ppb or less.

Next, the chemical structure of the prepolymer was examined with an infrared analyzer (produced by Nihon Bunko Kabushiki Kaisha: FT-IR-III type). Because double peaks assigned to siloxane bond are found in the vicinity of 1100cm$^{-1}$, it is confirmed that the prepolymer has structure expressed by the following general formula (in the formula, n indicates an integer):

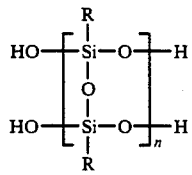

As described above, according to the present invention, a stress buffering film is formed of an organo-silicone ladder polymer having a hydroxyl group at its end, so that a chemical reaction is caused by a thermal treatment between hydroxyl groups on a surface of a substrate and hydroxyl groups of the organo-silicone ladder polymer, resulting in forming strong covalent bond between the two. Accordingly, the adhesive property between the organo-silicone ladder polymer which is a stress buffering film and an underlying substrate is enhanced. As a result, water does not penetrate into the interface of the organo-silicone ladder polymer and the underlying substrate, resulting in an improvement of the moisture resistance of a semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device sealed with mold resin, comprising:
    a semiconductor substrate having a main surface;
    an element formed on the main surface of said semiconductor substrate;
    a stress buffering film for protecting at least the element from stress caused by a mold resin, said stress buffering film being provided on said semiconductor substrate so as to cover at least said element; and
    a mold resin which completely encapsulates said semiconductor device;
    wherein said stress buffering film is formed of organo-silicone ladder polymer having the following structure:

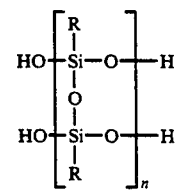

where R represents a substituted group and n represents an integer.

2. The semiconductor device according to claim 1, wherein said substitution group R includes a phenyl group.

3. The semiconductor device according to claim 1, wherein said integer n is an integer with which a weight-average molecular weight of said organo-silicone ladder polymer is 100,000 or more.

4. The semiconductor device according to claim 3, wherein said integer n is an integer with which the weight-average molecular weight of said organo-silicone ladder polymer is 100,000-200,000.

5. The semiconductor device according to claim 1, wherein a film thickness of said stress buffering film is 4-10μm.

6. The semiconductor device according to claim 1, wherein filler is filled in said mold resin.

7. The semiconductor device according to claim 1, wherein
    said organo-silicone ladder polymer contains 1ppm or less of each of alkali metal, iron, lead, copper and hydrogen halogenide and 1ppb or less of each of uranium and thorium.

8. The semiconductor device according to claim 1, wherein
    said element includes a bonding pad, and
    said stress buffering film is provided over the entire surface of said semiconductor substrate except said bonding pad.

9. The semiconductor device according to claim 1, wherein said stress buffering film is formed by spin coating.

* * * * *